United States Patent
Basker et al.

(10) Patent No.: US 8,703,572 B2
(45) Date of Patent: Apr. 22, 2014

(54) EMBEDED DRAM CELL STRUCTURES WITH HIGH CONDUCTANCE ELECTRODES AND METHODS OF MANUFACTURE

(75) Inventors: Veeraraghavan S. Basker, Schenectady, NY (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 13/269,955

(22) Filed: Oct. 10, 2011

(65) Prior Publication Data

US 2013/0087841 A1    Apr. 11, 2013

(51) Int. Cl.
*H01L 21/331*  (2006.01)

(52) U.S. Cl.
USPC .................................. 438/367; 257/E21.645

(58) Field of Classification Search
USPC ................... 257/303, E21.645; 438/396, 367
See application file for complete search history.

(56) References Cited

U.S. PATENT DOCUMENTS

| | | |
|---|---|---|
| 5,789,320 A | 8/1998 | Andricacos et al. |
| 6,294,425 B1 | 9/2001 | Hideki |
| 6,323,127 B1 | 11/2001 | Andricacos et al. |
| 6,468,858 B1 | 10/2002 | Lou |
| 6,524,461 B2 | 2/2003 | Taylor et al. |
| 6,630,387 B2 | 10/2003 | Horii |
| 7,575,970 B2 * | 8/2009 | Ho et al. ........................ 438/246 |
| 7,671,394 B2 | 3/2010 | Booth, Jr. et al. |
| 7,741,188 B2 | 6/2010 | Dyer et al. |
| 7,863,189 B2 | 1/2011 | Basker et al. |
| 2002/0105051 A1 * | 8/2002 | Bertin et al. ................... 257/530 |
| 2005/0155865 A1 * | 7/2005 | Mishima et al. ............... 205/170 |
| 2008/0164573 A1 | 7/2008 | Basker et al. |
| 2009/0057154 A1 * | 3/2009 | Basker et al. .................... 205/91 |
| 2009/0236691 A1 * | 9/2009 | Dyer et al. ..................... 257/532 |
| 2010/0240191 A1 * | 9/2010 | Chung et al. ................... 438/386 |

OTHER PUBLICATIONS

Wang, G. et al., "A 0.127 μm2 High Performance 65nm SOI Based embedded DRAM for on-Processor Applications" International Electron Devices Meeting, IEDM '06, Dec. 11-13, 2006, 4 pages.

* cited by examiner

*Primary Examiner* — Kimberly Rizkallah
*Assistant Examiner* — Duy T Nguyen
(74) *Attorney, Agent, or Firm* — Michael Le Strange; Roberts Mlotkowski Safran & Cole, P.C.

(57) ABSTRACT

A method and structure is directed to eDRAM cells with high-conductance electrodes. The method includes forming upper layers on a semiconductor substrate and forming an opening in the upper layers. The method further includes forming a trench in the semiconductor substrate, aligned with the opening. The method further includes forming a metal plate on all exposed surface in the trench by applying a metallic aqueous solution with an electrical bias to a backside of the semiconductor substrate.

9 Claims, 7 Drawing Sheets

EMBEDED DRAM CELL STRUCTURES WITH HIGH CONDUCTANCE ELECTRODES AND METHODS OF MANUFACTURE

FIELD OF INVENTION

The invention relates to semiconductor structures and methods of manufacture and, more particularly, to eDRAM cells with high-conductance electrodes and methods of manufacture.

BACKGROUND

Embedded DRAM (eDRAM) is a capacitor-based dynamic random access memory integrated on the same die as an ASIC or processor. Embedding memory on an ASIC or a processor allows for higher operational speeds because low latency memory is on-chip, cutting delays due to wiring parasitics. Embedded DRAM also enables significantly larger bandwidth busses by virtue of removing the wiring bottleneck to off-chip memory systems. Also, larger amounts of memory can be installed on smaller chips to realize equivalent storage capacity using eDRAM since eDRAM has much higher density in comparison to SRAM. Although eDRAM requires additional fabrication process steps, the area savings of eDRAM memory offsets the additional process cost when a significant amount of memory is used in the design.

Factors such as parasitic resistance and capacitance in the trench capacitor can limit the performance of eDRAM cells. Various techniques can be used to mitigate these factors (e.g., reduce resistance by increased doping level), but these techniques can have limited effectiveness due to the high aspect ratio of the capacitor. For example, in one example, a trench can be formed in a substrate, and can undergo an anisotropic implant process to form a buried plate. Thereafter, an insulator layer and a polysilicon layer are deposited within the trench to form the capacitor. A transistor (gate) is then formed on the substrate, proximate to the capacitor; however, due to the capacitor formation processes, the resistive element (i.e., the polysilicon) of the capacitor connects to the diffusion region of the transistor, resulting in increased capacitor resistance. This increased access resistance, in turn, limits the switching performance of the capacitor.

Accordingly, there exists a need in the art to overcome the deficiencies and limitations described hereinabove.

SUMMARY

In an aspect of the invention, a method comprises forming upper layers on a semiconductor substrate and forming an opening in the upper layers. The method further comprises forming a trench in the semiconductor substrate, aligned with the opening. The method further comprises forming a metal plate on all exposed surfaces in the trench by applying a metallic aqueous solution with an electrical bias to a backside of the semiconductor substrate.

In another aspect of the invention, a method comprises depositing a pad layer on top of a semiconductor layer provided on an insulator layer and semiconductor substrate. The method further comprises depositing a hardmask over the pad layer. The method further comprises etching an opening through the insulator layer, semiconductor layer, pad layer and hardmask. The method further comprises forming an isolation spacer along sidewalls of the opening. The method further comprises etching a trench through the semiconductor substrate and in alignment with the opening. The method further comprises applying an aqueous solution and electrical bias from a backside of the semiconductor substrate to form a metal plate in the trench.

In yet another aspect of the invention, a structure comprises: a semiconductor substrate; a trench in the semiconductor substrate and in alignment with an opening; a conformal metal plate lining exposed surfaces of the trench; a dielectric liner on the conformal metal plate; a metal inner electrode on the dielectric liner; and a contact in contact with the metal inner electrode.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the plated structures and/or eDRAM cells, which comprises the structures of the present invention. In still further embodiments, a method in a computer-aided design system is provided for generating a functional design model of the plated structures and/or eDRAM cells. The method comprises generating a functional representation of the structural elements of the plated structures and/or eDRAM cells.

BRIEF DESCRIPTION OF THE SEVERAL VIEWS OF THE DRAWINGS

The present invention is presented in the detailed description that follows, in reference to the noted plurality of drawings by way of non-limiting examples of exemplary embodiments of the present invention.

DETAILED DESCRIPTION

The invention relates to semiconductor structures and methods of manufacture and, more particularly, to eDRAM cells with high-conductance electrodes and methods of manufacture. The present invention also includes a high-conductance substrate contact. In embodiments, the eDRAM cells and high-conductance substrate contact are formed using an aqueous solution to form an inner plate and/or outer plate, depending on the particular structure. For example, the eDRAM cell can be formed using an aqueous solution of $PtCl_4$ (platinum chloride) or $H_2PtCl_6$ (chloroplatinic acid), to form an inner plate and/or an outer plate composed of platinum. The inner plate and/or outer plate can also be composed of different materials such as, for example, gold, palladium, platinum, silver or other conductive material or alloys thereof, using the plating techniques of the present invention, e.g., using a plating solution containing gold salts/acids/solutes instead of platinum salts/acids/solutes. Additional materials for the inner plate and/or outer plate can include Ru, Rh, Ni, Co and/or alloys of Ir (Pt—Ir for example), Os and Re. In embodiments, additional plating methods and structures are providing including a reduced resistance plug electrode, a reduced resistance substrate electrode, and a reduced resistance plug and substrate structures.

Advantageously, by implementing the processes of the present invention, the inner plate and/or outer plate exhibit improved comformality along trench walls that form the capacitor. Also, platinum offers low resistance, i.e., provides reduce resistance in eDRAM capacitors which, in turn, increases or improves switching performance of the capacitor. Other metals using the plating techniques of the present invention can also provide these advantages.

FIGS. 1a-1d show structures and respective manufacturing processes in accordance with aspects of the invention. More specifically, FIGS. 1a-1d show structures and respective manufacturing processes for manufacturing an eDRAM capacitor cell. According to aspects of the present invention, the manufacturing process shown in FIGS. 1a-1d will eliminate the need for a doping process to form a heavily-doped well for a trench capacitor. It should be understood by those of skill in the art that the processes, materials and dimensions herein may be applicable to each of the aspects of the present invention and, as such, may not be repeated for the sake of clarity and brevity.

Figure 1A:
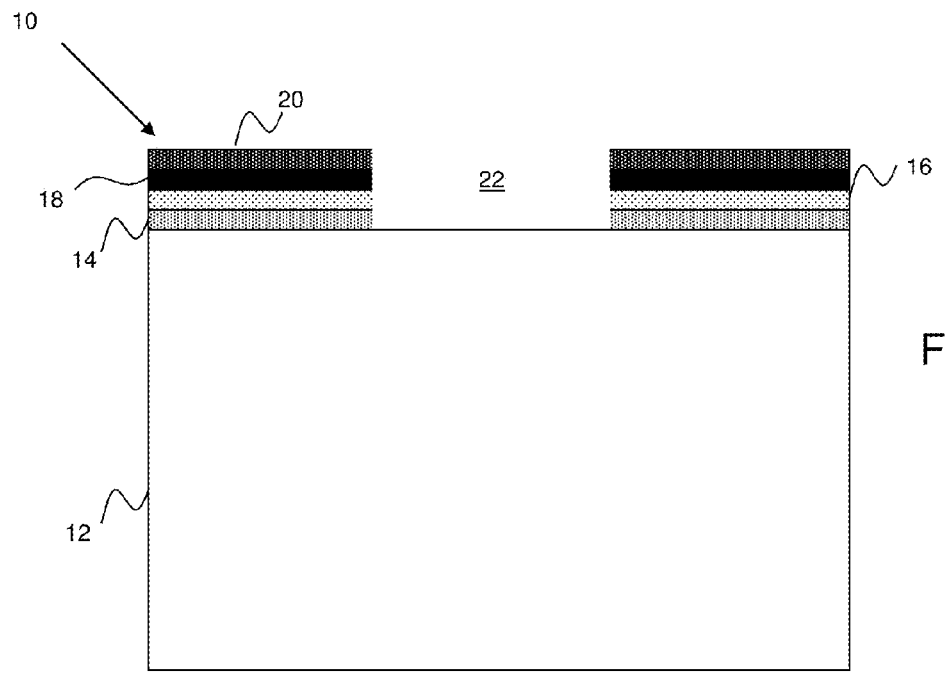
FIGS. 1a-1d show structures and respective manufacturing processes in accordance with aspects of the invention.

In FIG. 1a, a structure 10 comprises a substrate 12. The substrate 12 can be, for example, a p-doped silicon substrate. In embodiments, the substrate can be SiGe or other silicon heterostructure material, or any known silicon on insulator (SOI) materials. An insulator layer 14, e.g., oxide, is formed on the substrate 12. In an SOI implementation, the insulator layer 14 can be a buried oxide layer (BOX) formed by conventional SIMOX processes (Separation by IMplantation of Oxygen) or wafer bonding techniques. A semiconductor layer 16, e.g., silicon film, is formed on the insulator layer 14. In SOI implementations, the silicon film can be formed by conventional methods such as SIMOX and wafer bonding.

A pad layer 18 is formed on the semiconductor layer 16, which may be formed by a deposition process. In embodiments, the pad layer 18 is $SiO_2$ deposited to a thickness of about 10 nm to about 100 nm. A hardmask 20 is formed on the pad layer 18, which may be SiN. The hardmask 20 can be deposited to a thickness of about 10 nm to about 100 nm. The pad layer 18 and the hard mask 20 are upper layers of formed over the semiconductor layer 16, which can comprise a variety of different materials used for the same purpose. The deposition process for forming the pad layer 18 and the hardmask 20 can be any appropriate deposition process such as chemical vapor deposition (CVD).

An opening 22 is formed through the insulator layer 14, semiconductor layer 16, pad layer 18 and the hardmask 20, using conventional lithographic and etching processes. For example, a resist can be formed on the hardmask 20 and exposed to light to form a pattern (opening). An etching process is then performed through the pattern to form opening 22. The etching process can be a reactive ion etching (RIE). The resist can then be removed using a conventional ashing process. In embodiments, the opening 22 is about 20 nm in cross section.

Figure 1B:
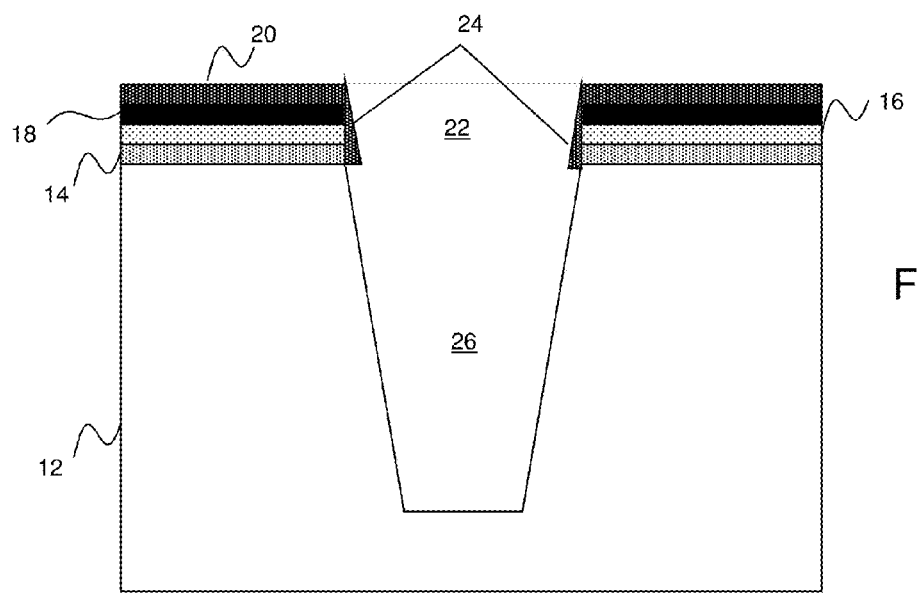

In FIG. 1b, a hardmask material 24 is formed on the sidewalls of the opening 22. The hardmask material 24 can be a nitride material. An anisotropic etch is then performed to form a trench 26, aligned with the opening 22. In embodiments, the trench 26 can be slightly tapered. The trench 26 can have different dimensions and trench aspect ratios, depending on the design parameters of the capacitor (or substrate contact). For example, in an eDRAM capacitor, the trench 26 can be about 3 microns to 8 microns deep.

Figure 1C:
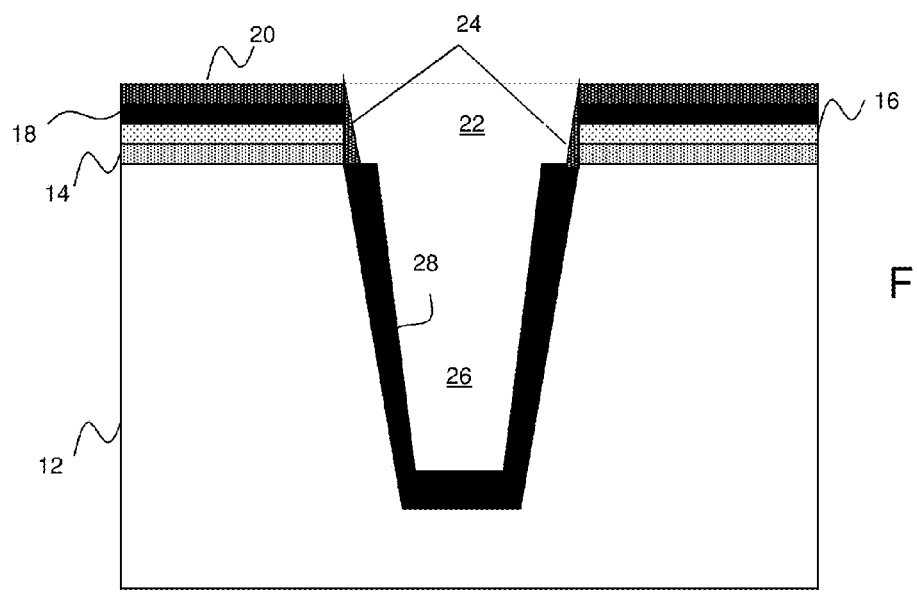

In FIG. 1c, an outer plate 28 is formed on the exposed portions of the substrate 10, within the trench 26 (i.e., sidewalls and bottom). As shown in FIG. 1c, the hardmask material 24 isolates the exposed portions of the insulator layer 14, semiconductor layer 16, pad layer 18 and the hardmask 20 from the outer plate 28. In embodiments, the outer plate 28 can be composed of platinum or gold with a thickness of about 30 nm; although other thicknesses and other outer plate materials are contemplated by the present invention, depending on the dimensions of the trench 26 and/or the designed parameters of the capacitor, for example In embodiments, the outer plate 28 is formed by a plating process that provides a uniform or conformal thickness on the exposed surfaces of the trench 26. More specifically, the outer plate 28 is formed by applying an aqueous solution of $PtCl_4$ or $H_2PtCl_6$ with an electrical bias. The aqueous solution can be applied under different conditions depending on the dimensions of the trench 26 and the required thickness of the outer plate 28. For example, the aqueous solution can be applied at about 50° C. and electrical bias current of 10-20 mA/cm$^2$ to a backside of the substrate 12. It should be understood that other aqueous solutions are also contemplated by the present invention, in order to provide other metal plates, such as Ag. In the metal plate formation process, the substrate forms one electrode while another electrode is placed adjacent in solution. This allows the trench in electrical contact with the substrate to also act as part of the electrode for plating.

Figure 1D:
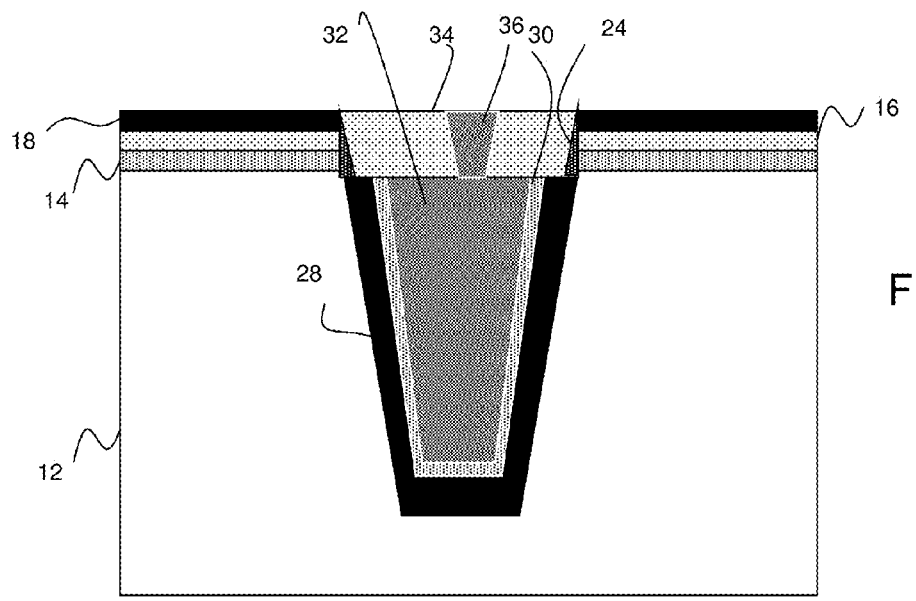

In FIG. 1d, a dielectric material 30 is formed on the outer plate 28. The dielectric material 30 can be a high-k dielectric eDRAM capacitor material such as $HfO_2$ or $ZrO_2$. The dielectric material 30 can be deposited using any conventional deposition process such as CVD. It should be understood by those of skill in the art that the high-k gate dielectric material will reduce leakage, compared to $SiO_2$, which, in turn, provides higher capacitance for an eDRAM capacitor.

An inner plate 32 is formed on the insulator material 30. The inner plate 32 can be, for example, a deposited doped polysilicon material that fills the remaining portion of the trench 26, to form an electrode for a capacitor structure. In embodiments, an upper surface of the inner plate 32 (and the insulator material 30) is planar or substantially planar with an upper surface of the substrate 12 (i.e., below a surface of the hardmask material 24). In an optional embodiment, the hardmask material 24 can be removed after deposition of the inner plate 32.

Still referring to FIG. 1d, an oxide cap 34 is deposited within the opening 22, and on any exposed surfaces of the outer plate 28, insulator material 30 and inner plate 32. A contact 36 can be formed in the oxide cap 34, in contact with the inner plate 32. The contact 36 can be a doped poly contact, formed by conventional lithographic, etching and deposition processes.

Figure 2A:
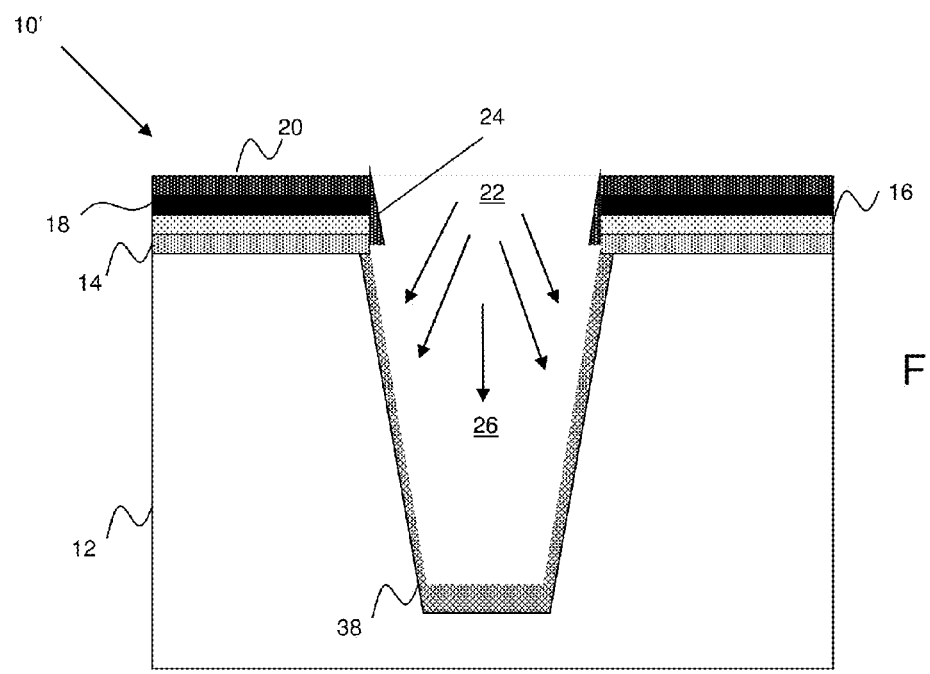
FIGS. 2a and 2b show structures and respective manufacturing processes in accordance with additional aspects of the invention.
Figure 2B:
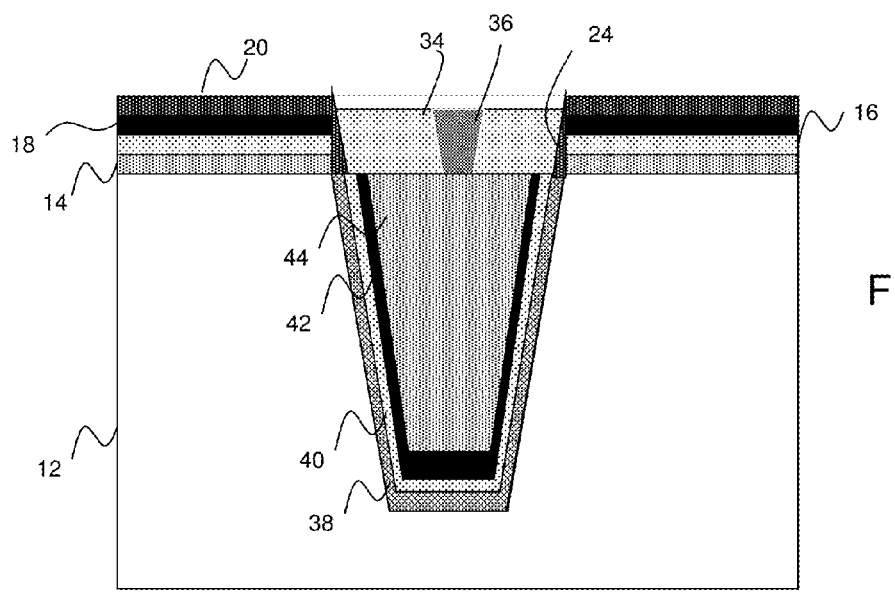

FIGS. 2a and 2b show structures and respective manufacturing processes in accordance with additional aspects of the invention. More specifically, FIG. 2a shows structure 10' undergoing a well implant or doping process to form an outer diffusion region 38. The outer diffusion region 38 will increase conductance between the inner plate (not shown) and the substrate 10.

More specifically, in FIG. 2a, the structure 10' comprises a substrate 12, e.g., a p-doped silicon substrate, SiGe or any known silicon on insulator (SOI) materials. An insulator layer 14 is formed on the substrate 12, and a semiconductor layer 16 is formed on the insulator layer 14. A pad layer 18 is formed on the semiconductor layer 16, which may be $SiO_2$ deposited to a thickness of about 10 nm to about 100 nm. A hardmask 20 is formed on the pad layer 18, which may be SiN deposited to a thickness of about 10 nm to about 100 nm.

Still referring to FIG. 2a, an opening 22 is formed through the insulator layer 14, semiconductor layer 16, pad layer 18 and the hardmask 20, using conventional lithographic and etching processes. In embodiments, the opening 22 is about 20 nm in cross section. A hardmask material 24, e.g., a silicon nitride material, is formed on the sidewalls of the opening 22. In embodiments, the hardmask material 24 will form sidewalls that can extend between the top layer 20 to the bottom layer 14, or any space therebetween. An anisotropic etch is then performed to form a slightly tapered trench 26. An n-well implant or doping process is performed to form outer diffusion region 38. In embodiments, the ion or doping species can be phosphorous.

In FIG. 2b, an insulator material 40 is formed within the trench 26, in contact with the diffusion region 38. The insulator material 40 can be $HfO_2$ or $ZrO_2$ or other high-k dielectric material. An inner plate 42 is formed on the insulator material 40 using, for example, the aqueous solution and accompanying processes discussed with reference to FIG. 1c. More specifically, the inner plate 42 is formed by applying an aqueous solution of $PtCl_4$ or $H_2PtCl_6$ at about 50° C. and bias 10-20 mA/cm$^2$ to a backside of the substrate 12; although other conditions are also contemplated by the present invention. For example, the aqueous solution can form metal plates, such as Ag. In embodiments, the inner plate 42 is about 2-3 nm thick. An in-situ deposition of doped poly or other similar conductor can be formed to complete the formation of an electrode 44.

Still referring to FIG. 2b, an oxide cap 34 is deposited within the opening 22, and on any exposed surfaces of the insulator material 40, inner plate 42 and the electrode 44. A contact 36 can be formed in the oxide cap 34, in contact with the electrode 44. The contact 36 can be a poly contact, formed through conventional lithographic, etching and deposition processes. In embodiments, the contact 36 can be formed by a plating process or a metal sputtering process, known to those of skill in the art. This same process can be used in any of the aspects of the present invention.

Figure 3:
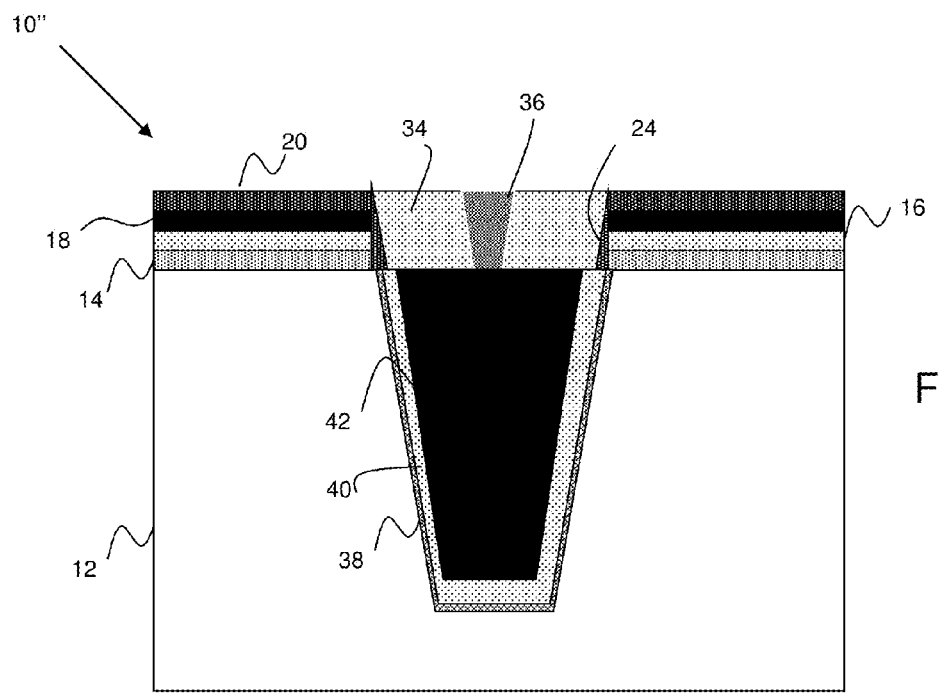
FIG. 3 shows a structure and respective manufacturing processes in accordance with additional aspects of the invention.

FIG. 3 shows an alternative structure 10'' and respective manufacturing processes in accordance with additional aspects of the invention. In FIG. 3, the trench (e.g., trench 26) can be filled completely with the plated material. More specifically, after trench formation, the substrate 12 is implanted or doped to form outer diffusion region 38. An insulator material 40 is formed within the trench, in contact with the diffusion region 38. An inner plate 42 is formed on the insulator material 40 using, for example, the plating processes discussed with reference to FIG. 1c. In this process, the inner plate 42 can be formed on the insulator material 40 by tunneling a current of the electrical bias through the insulator material 40. After the plating process, the trench can be completely filled with the plating material, e.g., platinum or gold, using conventional deposition processes (or continuing with the plating process). In embodiments, in the metal plate formation process (a plating process), the substrate forms one electrode while another electrode is placed adjacent, in solution. This allows the trench that is in electrical contact with the substrate to also act as part of the electrode for plating.

An oxide cap 34 is deposited within the opening 22, and on any exposed surfaces of the insulator material 40 and inner plate 42. A contact 36 can be formed in the oxide cap 34, in contact with the inner plate 42.

Figure 4:
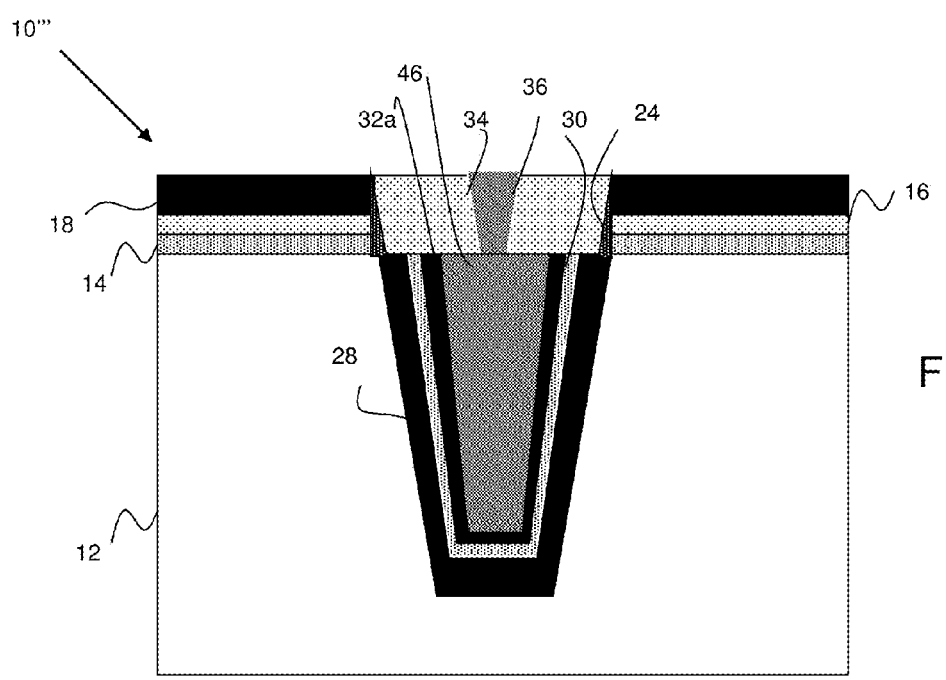
FIG. 4 shows a structure and respective manufacturing processes in accordance with additional aspects of the invention.

FIG. 4 shows structures and respective manufacturing processes in accordance with additional aspects of the invention. According to aspects of the present invention, the manufacturing processes shown in FIG. 4 eliminate the need for a doping process to form a heavily-doped well for a trench capacitor. In the embodiments of FIG. 4, the structure 10''' includes an outer plate 28 formed on the exposed portions of the substrate 10, within the trench (26) (i.e., sidewalls and bottom). In embodiments, the outer plate 28 can be platinum with a thickness of about 2-3 nm; although other thicknesses are contemplated by the present invention, depending on the dimensions of the trench 26 and/or the designed parameters of the capacitor, for example.

In embodiments, the outer plate 28 is formed using the plating processes described herein. More specifically, the outer plate 28 is formed by applying an aqueous solution of $PtCl_4$ or $H_2PtCl_6$ with an electrical bias. The aqueous solution can be applied under different conditions depending on the dimensions of the trench 26 and the required thickness of the outer plate 28. For example, the aqueous solution can be applied at about 50° C. and bias 10-20 mA/cm$^2$ to a backside of the substrate 12.

Still referring to FIG. 4, an insulator material 30 is formed on the outer plate 28. The insulator material 30 can be an eDRAM capacitor dielectric material such as $HfO_2$ or $ZrO_2$. An inner plate 32a is formed on the insulator material 30. The inner plate 32a can be formed in same or similar manner to the outer plate 28, with the current tunneling through the insulator material 30. In particular, the inner plate 32a can be formed by applying an aqueous solution of $PtCl_4$ or $H_2PtCl_6$ at about 50° C. and bias 10-20 mA/cm$^2$, tunneled through the insulator material 30. In embodiments, the inner plate 32a is about 2-3 nm thick; although other dimensions are also contemplated by the present invention.

Polysilicon material 46 fills the remaining portion of the trench to form an electrode for a capacitor structure. As should be understood by those of skill in the art, the electrode can comprise the polysilicon material 46 and the inner plate 32a. As in all embodiments, as an optional step, the hardmask material 24 can be removed after deposition of the electrode (e.g., inner plate and/or polysilicon material). An oxide cap 34 is deposited within the opening (e.g., opening 22), and on any exposed surfaces of the outer plate 28, insulator material 30, inner plate 32a and polysilicon material 46. A contact 36 is formed in the oxide cap 34, in contact with the polysilicon material 46. The contact 36 can be a poly contact, formed through conventional lithographic, etching and deposition processes.

Figure 5:
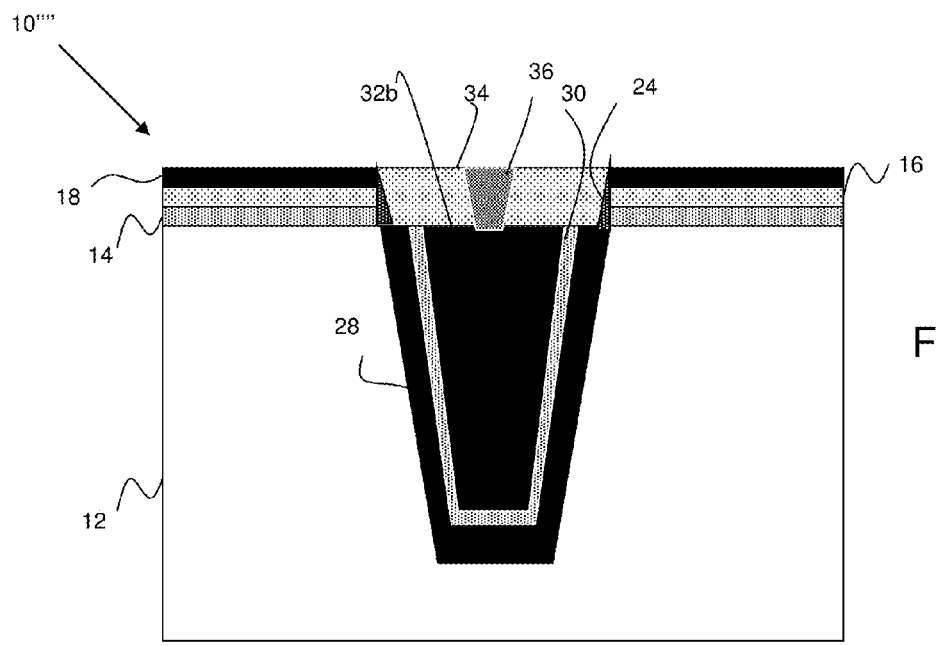
FIG. 5 shows a structure and respective manufacturing processes in accordance with additional aspects of the invention.

FIG. 5 shows a structure and respective manufacturing processes in accordance with additional aspects of the invention. According to aspects of the present invention, the manufacturing processes shown in FIG. 5 eliminates the need for a doping process to form a heavily-doped well for a trench capacitor. Similar to the embodiment of FIG. 4, the structure 10'''' includes an outer plate 28 formed on the exposed portions of the substrate 10, within the trench 26 (i.e., sidewalls and bottom), using an aqueous solution of $PtCl_4$ or $H_2PtCl_6$ with an electrical bias. In embodiments, the outer plate 28 can be platinum with a thickness of about 2-3 nm; although other thicknesses and metals are contemplated by the present invention, depending on the dimensions of the trench 26 and/or the designed parameters of the capacitor, for example.

Still referring to FIG. 5, a dielectric material 30 is formed on the outer plate 28. The dielectric material can be an eDRAM capacitor dielectric material such as $HfO_2$ or $ZrO_2$. An inner plate 32b is formed on the dielectric material 30. The inner plate 32b can be formed in same or similar manner to the outer plate 28, e.g., using an aqueous solution of $PtCl_4$ or $H_2PtCl_6$ at about 50° C. and bias 10-20 mA/cm$^2$, tunneled through the dielectric material 30. In embodiments, the inner plate 32b can be formed by a plating process or a metal sputtering process, known to those of skill in the art. In embodiments and similar to the embodiment shown in FIG. 3, after the plating process, the trench can be completely filled with the plating material 32b, e.g., platinum or gold, using conventional deposition processes (or continuing with the plating process) to form the electrode for a capacitor structure. An oxide cap 34 is deposited within the opening 22, and on any exposed surfaces of the dielectric material 30 and inner plate 32b. A contact 36 can be formed in the oxide cap 34, in communication with the inner plate 32b.

Figure 6A:
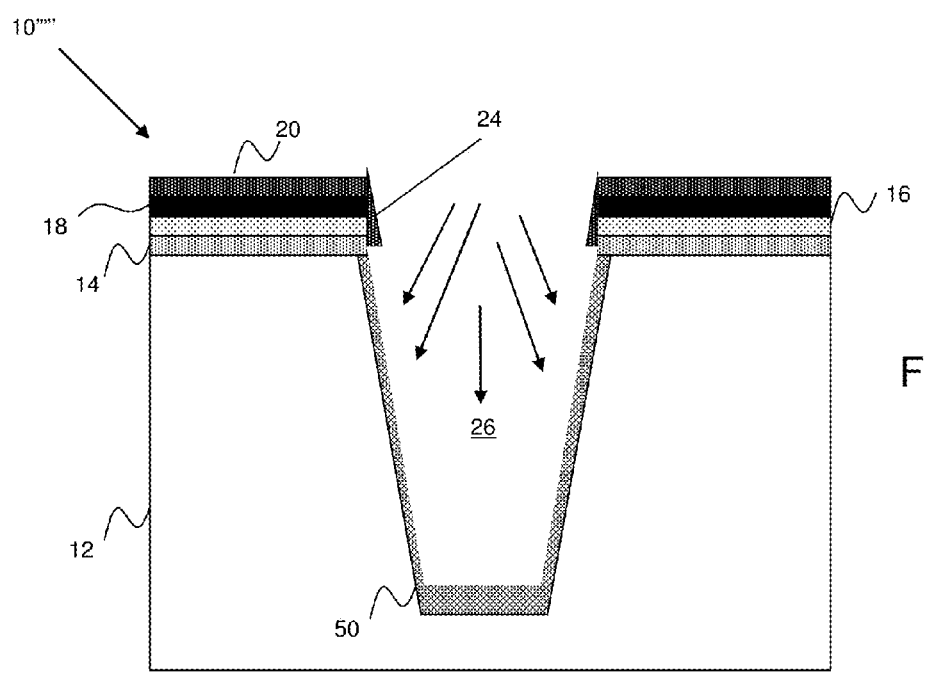
FIGS. 6a-6c show a plated structure and respective manufacturing processes in accordance with additional aspects of the invention.
Figure 6B:
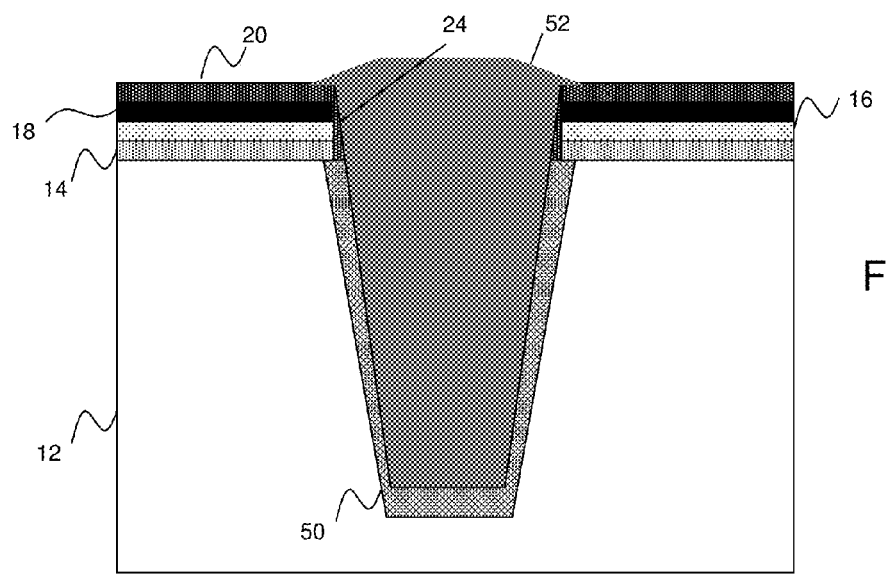
Figure 6C:
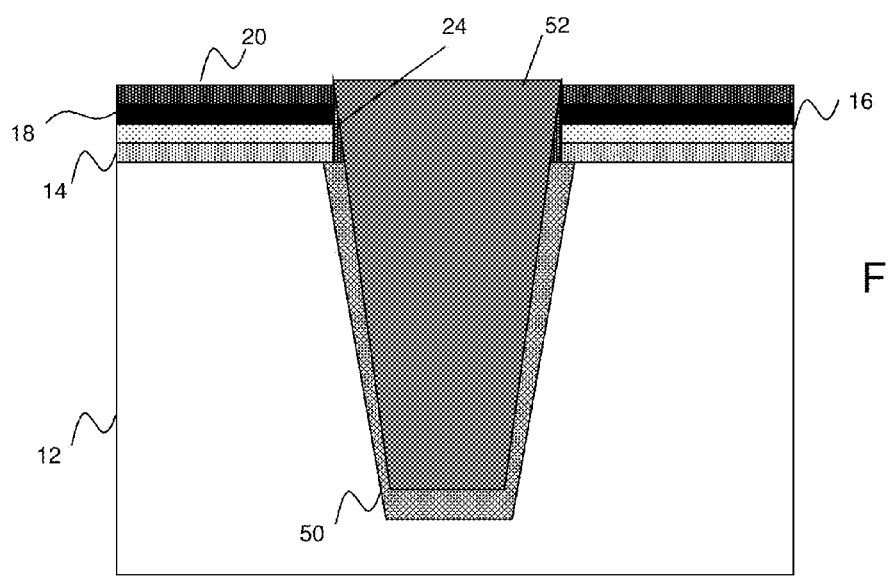

FIGS. 6a-6c show structures and respective manufacturing processes in accordance with additional aspects of the invention. In FIG. 6a, the structure 10'''' comprises a substrate 12, e.g., a p-doped silicon substrate, Si heterostructure material, or any known silicon on insulator (SOI) materials. An insulator layer 14 is formed on the substrate 12, and a semiconductor layer 16 is formed on the insulator layer 14. A pad layer 18 is formed on the semiconductor layer 16, which may be $SiO_2$ deposited to a thickness of about 10 nm to about 100 nm. A hardmask 20 is formed on the pad layer 18, which may be SiN deposited to a thickness of about 10 nm to about 100 nm. An opening 22 is formed through the insulator layer 14, semiconductor layer 16, pad layer 18 and the hardmask 20, using conventional lithographic and etching processes. In embodiments, the opening 22 is about 20 nm in cross section. A hardmask material 24, e.g., nitride material, is formed on the sidewalls of the opening 22. An anisotropic etch is then performed to form a trench 26, aligned with the opening 22. An n-well implant or doping is performed to form outer diffusion region 50. The species of the implant or dopant can be phosphorous.

In FIG. 6b, a terminal 52 is formed on the outer diffusion region 50 by applying an aqueous solution of $PtCl_4$ or $H_2PtCl_6$ at about 50° C. and bias 10-20 mA/cm$^2$; although other conditions and solutions are also contemplated by the present invention depending on the desired dimensions of the trench and the metal material. For example, the aqueous solution can form a metal plate, such as Ag. In embodiments, the plate 52 completely fills the trench 26 and the opening 22. In FIG. 6c, the plate 52 is planarized using, for example, conventional chemical mechanical polishing (CMP).

Figure 7:
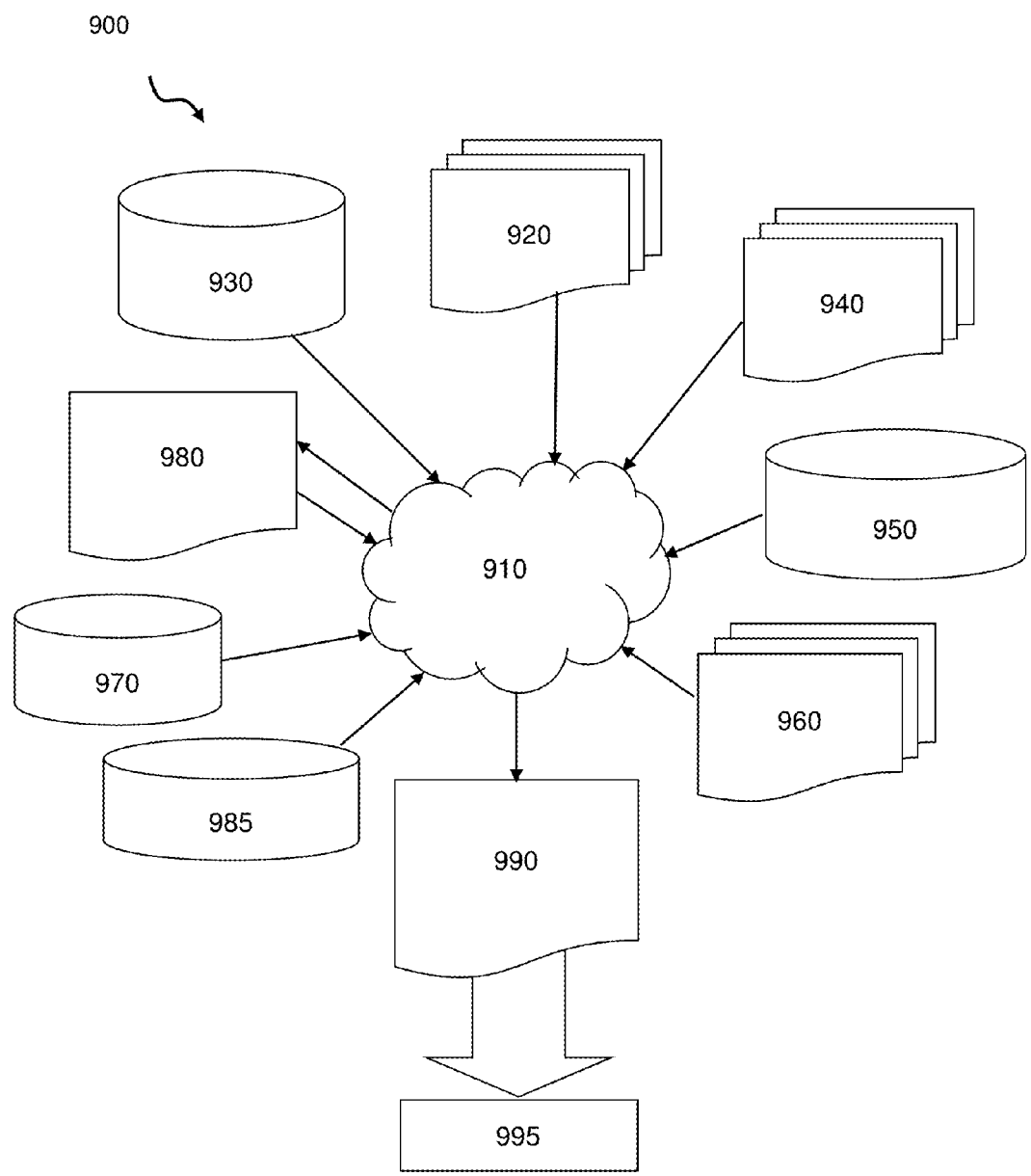
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1a-6c. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific integrated circuit (ASIC) may differ from a design flow 900 for designing a standard component or from a design flow 900 for instantiating the design into a programmable array, for example a programmable gate array (PGA) or a field programmable gate array (FPGA). offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1a-6c. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1a-6c to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1*a*-6*c*. In one embodiment, design structure 990 may comprise a compiled, executable HDL simulation model that functionally simulates the devices shown in FIGS. 1*a*-6*c*.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1*a*-6*c*. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw substrate form (that is, as a single substrate that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    forming upper layers on a semiconductor substrate, the semiconductor substrate being a single uniformly doped layer of silicon substrate;
    forming an opening in the upper layers;
    forming a trench in the semiconductor substrate, aligned with the opening;
    forming a metal plate on all exposed surfaces in the trench by applying a metallic aqueous solution with an electrical bias to a backside of the semiconductor substrate;
    forming an insulator material on the metal plate;
    forming an inner plate on the insulator material; and
    forming a contact in an oxide layer formed on the inner plate, the contact being formed on a portion of a surface area of the inner plate,
    wherein the semiconductor substrate is an electrode that receives the electrical bias.

2. The method of claim 1, wherein the metallic aqueous solution is $PtCl_4$ or $H_2PtCl_6$ and the metal plate is a conformal platinum layer on a surface of the trench.

3. The method of claim 2, wherein the conformal platinum layer is about 2-3 nm thick.

4. The method of claim 2,
    wherein the metal plate is an outer metal plate formed on exposed surfaces of the trench.

5. The method of claim 1, wherein the metal plate is gold, palladium, platinum, or silver.

6. The method of claim 1, further comprising forming a diffusion region in the semiconductor substrate of the trench, wherein the metal plate is provided on the diffusion region and completely fills the trench and the opening.

7. The method of claim 1, further comprising protecting sidewalls of the opening with a mask material, prior to forming the trench.

8. A method comprising:
depositing a pad layer on top of a semiconductor layer provided on an insulator layer and semiconductor substrate, the semiconductor substrate being a single uniformly doped layer of silicon substrate;
depositing a hardmask over the pad layer;
etching an opening through the insulator layer, semiconductor layer, pad layer and hardmask;
forming an isolation spacer along sidewalls of the opening;
etching a trench in the semiconductor substrate and in alignment with the opening;
applying an aqueous solution and electrical bias from a backside of the semiconductor substrate to form a metal plate in the trench;
depositing a dielectric liner on the metal plate;
depositing a polysilicon material in the trench to form an electrode;
forming a contact on a portion of a surface area of the electrode; and
forming an oxide cap layer in the opening, wherein the contact is in the oxide cap layer, and
wherein the semiconductor substrate is configured as another electrode to receive the electrical bias.

9. The method of claim 8, further comprising forming a diffusion region in the semiconductor substrate of the trench, wherein the metal plate is formed on the diffusion region and completely fills the trench and the opening.

\* \* \* \* \*